(12) United States Patent
Peng et al.

(10) Patent No.: US 11,909,357 B2
(45) Date of Patent: Feb. 20, 2024

(54) AMPLIFIER AND AMPLIFICATION METHOD

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN)

(73) Assignee: SMARTER MICROELECTRONICS (GUANG ZHOU) CO., LTD., Guangzhou (CN)

(*) Notice: Subject to any disclaimer, the term of this patent is extended or adjusted under 35 U.S.C. 154(b) by 574 days.

(21) Appl. No.: 17/134,245

(22) Filed: Dec. 25, 2020

(65) Prior Publication Data

US 2021/0167732 A1 Jun. 3, 2021

Related U.S. Application Data

(63) Continuation of application No. PCT/CN2020/113749, filed on Sep. 7, 2020.

(30) Foreign Application Priority Data

Dec. 2, 2019 (CN) .......................... 201911216084.1

(51) Int. Cl.
 *H03F 1/30* (2006.01)
 *H03F 1/02* (2006.01)
 *H03F 3/19* (2006.01)

(52) U.S. Cl.
 CPC ............ *H03F 1/0211* (2013.01); *H03F 3/19* (2013.01); *H03F 2200/171* (2013.01); *H03F 2200/451* (2013.01)

(58) Field of Classification Search
 CPC ........................................................ H03F 1/30
 USPC ........................................ 330/297, 296, 285
 See application file for complete search history.

(56) References Cited

U.S. PATENT DOCUMENTS

| | | | | |
|---|---|---|---|---|
| 5,663,681 A * | 9/1997 | Botti | ........................ | H03F 3/72 330/297 |
| 5,745,009 A * | 4/1998 | Leroux | ................. | H03F 3/1935 330/296 |
| 7,123,095 B2 * | 10/2006 | Tsutsui | ................. | H03G 3/3047 330/285 |
| 8,098,093 B1 * | 1/2012 | Li | ........................... | H03F 3/211 330/297 |
| 8,106,711 B2 * | 1/2012 | Adamski | ................. | H03F 3/211 330/297 |

* cited by examiner

*Primary Examiner* — Henry Choe
(74) *Attorney, Agent, or Firm* — Syncoda LLC; Feng Ma (57) ABSTRACT

An amplifier includes an amplification circuit, a power supplying circuit and an input circuit. A first end of the amplification circuit is connected with a first end of the input circuit; a second end of the amplification circuit is connected with the power supplying circuit; and a third end of the amplification circuit is connected with a second end of the input circuit. The power supplying circuit is at least configured to supply power to the amplification circuit so that the amplification circuit operates in an amplification region. The input circuit is at least configured to receive an input signal; the amplification circuit is configured to obtain an amplification gain in case of operating in the amplification region, and amplify the input signal by using the obtained amplification gain.

18 Claims, 3 Drawing Sheets

Supplying power, by using the power supplying circuit 12 of the amplifier, to the amplification circuit 11 of the amplifier so that the amplification circuit 11 operates in an amplification region; herein, a second end of the amplification circuit 11 is connected with the power supplying circuit 12

S602

Obtaining an amplification gain in the case that the amplification circuit 11 is in the amplification region, and amplifying, by using the obtained amplification gain, an input signal received by the input circuit 10 of the amplifier; herein, a first end of the amplification circuit 11 is connected with a first end of the input circuit 10; and a third end of the amplification circuit 11 is connected with a second end of the input circuit 10

FIG. 6

AMPLIFIER AND AMPLIFICATION METHOD

CROSS-REFERENCE TO RELATED APPLICATIONS

This application is a continuation of International Application No. PCT/CN2020/113749 filed on Sep. 7, 2020, which claims priority to Chinese Patent Application No. 201911216084.1 filed on Dec. 2, 2019. The disclosures of these applications are hereby incorporated by reference in their entirety.

BACKGROUND

The gain of an amplifier is an important indicator for evaluating the performance of the amplifier. However, due to the limitation of the physical characteristics (such as cut-off frequency $\omega_T$, etc.) of the amplifier itself, the gain of the amplifier will generally decrease with the increase of the frequency of an input signal, which is not conducive to the amplification of signal with higher frequency. In addition, upon amplifying signals with higher frequency such as high-frequency signals, since the gain of single-stage amplifier fail to meet the required gain requirement, high gain is often achieved by way of cascading multiple single-stage amplifiers. That is, the signal to be amplified is input to the first stage amplifier, then the output of each stage amplifier is connected with the input of a next stage amplifier, and the output of the last stage amplifier is taken as an output signal that has been amplified for the input signal.

SUMMARY

The present disclosure relates generally to amplification technologies, and more specifically to an amplifier and an amplification method.

Various embodiments of the present disclosure provide an amplifier and an amplification method, which can achieve the desired amplification effect and meet the amplification requirement without increasing the complexity of the circuit of the amplifier.

Some embodiments of the disclosure provide an amplifier which includes an amplification circuit, a power supplying circuit and an input circuit; herein, a first end of the amplification circuit is connected with a first end of the input circuit; a second end of the amplification circuit is connected with the power supplying circuit; and a third end of the amplification circuit is connected with a second end of the input circuit; and herein, the power supplying circuit is at least configured to supply power to the amplification circuit so that the amplification circuit operates in an amplification region;

the input circuit is at least configured to receive an input signal; and the amplification circuit is configured to obtain an amplification gain in case of operating in the amplification region, and amplify the input signal by using the obtained amplification gain.

In the above solution, the input signal is a high-frequency signal; and the input circuit includes a first capacitor and a capacitive circuit, and one end of the first capacitor is connected with one end of the capacitive circuit; the other end of the first capacitor is connected with the first end of the amplification circuit; the other end of the capacitive circuit is connected with the third end of the amplification circuit;

herein, the first capacitor is configured to filter the high-frequency signal to obtain an alternate current signal (AC signal) of the high-frequency signal;

the capacitive circuit is configured to determine an amplification gain of the high-frequency signal; and correspondingly, the amplification circuit is configured to amplify the AC signal according to the amplification gain.

In the above solution, the amplifier further includes a first inductor, and one end of the first inductor is connected with the third end of the amplification circuit and the other end of the capacitive circuit, respectively; and the other end of the first inductor is grounded;

herein, the first inductor is at least configured to obtain the amplification gain of the high-frequency signal according to the attribute of the high-frequency signal transmitted via the capacitive circuit.

In the above solution, the amplifier further includes an output circuit connected with the second end of the amplification circuit; and the output circuit is at least configured to output the amplified input signal.

In the above solution, the output circuit is further configured to filter the amplified input signal to obtain an output signal, and the output signal is an AC signal of the amplified input signal.

In the above solution, the power supplying circuit includes a power supply and a second inductor; herein, the power supply is connected with one end of the second inductor, and the other end of the second inductor is connected with the second end of the amplification circuit;

herein, the power supply is configured to supply power to the amplification circuit; and the second inductor is configured to at least control the power supply to output to the second end of the amplification circuit or control the amplified input signal to flow to the output circuit.

In the above solution, the capacitance value C of the capacitive circuit and the inductance value L of the first inductor satisfy $0<1-\omega^2 LC<1$; herein $\omega$ is the frequency of the input signal.

In the above solution, the capacitive circuit includes at least one capacitor or at least one adjustable capacitor.

In the above solution, the amplification circuit is a transistor; and the first end of the amplification circuit is the gate of the transistor; the second end of the amplification circuit is the drain of the transistor; and the third end of the amplification circuit is the source of the transistor.

The embodiments of the disclosure further provide an amplification method applied to an amplifier, and the amplifier includes an amplification circuit, a power supplying circuit and an input circuit; herein, a first end of the amplification circuit is connected with a first end of the input circuit; a second end of the amplification circuit is connected with the power supplying circuit; and a third end of the amplification circuit is connected with a second end of the input circuit;

herein, the power supplying circuit is at least configured to supply power to the amplification circuit so that the amplification circuit operates in an amplification region;

the input circuit is at least configured to receive an input signal; and the amplification circuit is configured to obtain an amplification gain in case of being in the amplification region, and amplify the input signal by using the obtained amplification gain.

The embodiments of the disclosure provide an amplifier and an amplification method, herein, the amplifier includes an amplification circuit, a power supplying circuit and an input circuit; and herein, a first end of the amplification circuit is connected with a first end of the input circuit; a second end of the amplification circuit is connected with the power supplying circuit; and a third end of the amplification circuit is connected with a second end of the input circuit; and herein, the power supplying circuit is at least configured to supply power to the amplification circuit so that the amplification circuit operates in an amplification region; the input circuit is at least configured to receive an input signal; and the amplification circuit is configured to obtain an amplification gain in case of operating in the amplification region, and amplify the input signal by using the obtained amplification gain.

In the embodiments of the disclosure, the amplification circuit operating in the amplification region can amplify the input signal according to the obtained amplification gain, and at least achieve the desired amplification effect. Furthermore, the amplifier of the embodiments of the disclosure can be used as a single-stage amplifier and also used as a multi-stage amplifier. The desired amplification effect may be achieved and the desired amplification requirement may be met with an uncomplicated circuit design.

DETAILED DESCRIPTION

In order to make the purpose, technical solutions and advantages of the disclosure clearer, the technical solutions of the embodiments of the disclosure will be described clearly and completely below with reference to the drawings of the embodiments of the disclosure, and apparently, the described embodiments are only a part of the embodiments of the disclosure, not all of them. Based on the embodiments of the disclosure, all other embodiments obtained by those ordinarily skilled in the art without paying any creative work belong to the protection scope of the disclosure. The embodiments of the disclosure and the features of the embodiments may be arbitrarily combined with each other without conflict.

The cascaded amplifiers achieved by cascading single-stage amplifiers with insufficient gain improves amplification gain, while brings the problem of complexity of circuit structure, resulting in high design complexity of cascaded amplification circuit, and the more single-stage amplifiers cascaded, the more power consumption of the cascaded amplifiers. Various embodiments of the present disclosure can address how to meet the amplification requirement without increasing complexity of the circuit of the amplifier.

Figure 1:
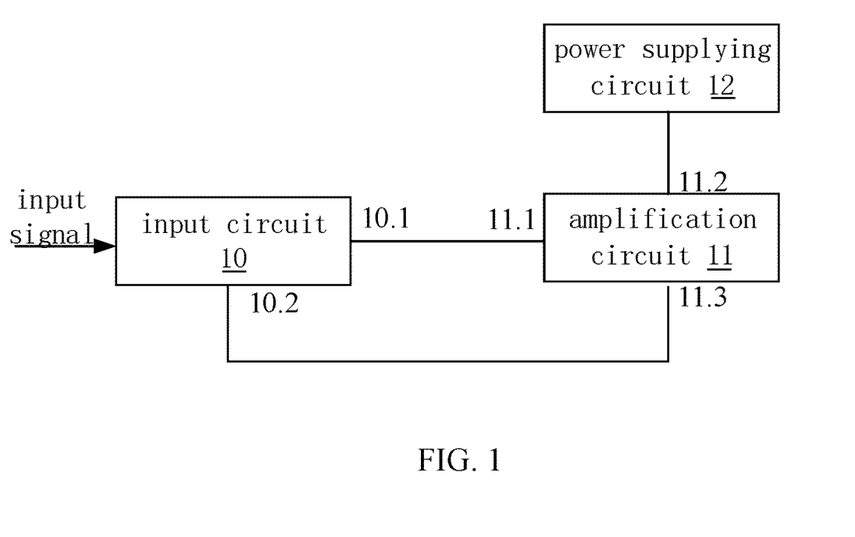
FIG. 1 is a first schematic diagram of the composition of circuit of an amplifier of an embodiment of the disclosure.

FIG. 1 is a first schematic diagram of the composition of circuit of an amplifier of an embodiment of the disclosure, and as illustrated in FIG. 1, the amplifier described by an embodiment of the disclosure includes: an input circuit 10, a power supplying circuit 12 and an amplification circuit 11;

herein, a first end 11.1 of the amplification circuit 11 is connected with a first end 10.1 of the input circuit 10; a second end 11.2 of the amplification circuit 11 is connected with the power supplying circuit 12; and a third end 11.3 of the amplification circuit 11 is connected with a second end 10.2 of the input circuit 10. It may be understood that the amplification circuit 11 has at least three ends (the first end, the second end and the third end), one of which is connected with the power supplying circuit 12 and the other two of which are connected with the input circuit 10. The connection structure is easier to implement, and the design of circuit structure is not complicated, and they are practical and easy to use, as well as easy to transplant.

In terms of implementation function, the power supplying circuit 12 is at least configured to supply power to the amplification circuit 11 so that the amplification circuit 11 operates in an amplification region;

the input circuit 10 is at least configured to receive an input signal; and the amplification circuit 11 is configured to obtain an amplification gain in case of operating in the amplification region, and amplify the input signal by using the obtained amplification gain.

It may be appreciated by those skilled in the art that the amplifier of the embodiments of the disclosure has an amplification function, and the amplification function is realized at least based on the amplification circuit 11. Generally, the amplification circuit 11 may operate in a cut-off region, an amplification region and a saturation region. The power supplying circuit 12 at least provides power supply for the amplification circuit 11, so that the amplification circuit 11 operates in the amplification region, and further to allow the amplifier circuit 11 to amplify the input signal to realize the amplification function of the amplifier.

In the embodiments of the disclosure, the amplification gain of the amplifier is related to the attribute (e.g., amplitude and phase) of the input signal and the amplification characteristics of the amplification circuit 11. It may be understood that the amplification characteristics of the amplification circuit 11 of the embodiments of the disclosure are mainly related to its own characteristics, and are also affected by the attribute (e.g., amplitude and polarity) of the power supply of the power supplying circuit 12, here, please refer to the following related descriptions for the details, and it will not be described by expansion in detail.

It can be seen from the above solution that the circuit structure provided by the embodiments of the disclosure is not complicated and easy to implement. The amplification circuit 11 operating in the amplification region may amplify the input signal according to the obtained amplification gain, and at least achieve the desired amplification effect. The design of amplifier circuit of the embodiments of the disclosure is not complicated, and may be used as a single-stage amplifier and also used as a multi-stage amplifier (at least two amplifiers as illustrated in FIG. 1 are cascaded for usage), and the desired amplification effect may be achieved whether it is used as a single-stage amplifier or a multi-stage amplifier. It may be preferably used as a single-stage amplifier.

By the simple combination of the input circuit 10, the power supplying circuit 12 and the amplification circuit 11, the amplifier provided by the embodiments of the disclosure may complete the amplification of the input signal while avoiding the problem of overly complex design of the relevant circuit and unnecessary power consumption.

The amplifier of the embodiments of the disclosure may be applied to any occasion where signal amplification is required, such as the amplification of low-frequency signals, the amplification of medium-frequency signals, and the amplification of high-frequency signals. That is, the input signal may be low-frequency signals, medium-frequency signals or high-frequency signals. As a preferred implementation, it may be applied to the amplification of radio frequency in high frequency occasion, and may amplify radio frequency signals effectively.

Figure 2:
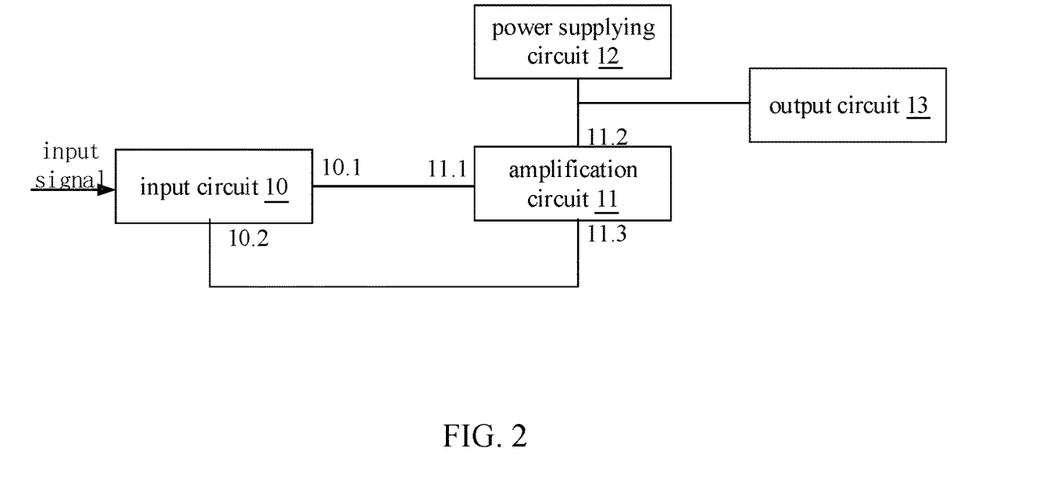
FIG. 2 is a second schematic diagram of the composition of circuit of an amplifier of an embodiment of the disclosure.

As illustrated in FIG. 2, the amplifier further includes an output circuit 13 which is connected with the second end 11.2 of the amplification circuit 11. The output circuit 13 is at least configured to output the amplified input signal, so that a device connected behind the amplifier may use the signal amplified by the amplifier of the embodiments of the disclosure.

In an alternative solution, the output circuit 13 is further configured to filter the amplified input signal to obtain an output signal, and the output signal is an AC signal of the amplified input signal. That is, before outputting the amplified signal, the output circuit 13 needs to filter the amplified signal first, and then output it after filtering.

For example, when the amplified input signal is an alternate current/direct current (AC/DC) mixed signal, the output circuit 13 filters out a DC signal of the mixed signal to obtain an AC signal. When the amplified input signal includes AC signals with at least two frequencies, the output circuit 13 may be used to filter out AC signals with one or more desired frequencies. When the amplified input signal is a mixed signal of positive half-wave signal and negative half-wave signal, the output circuit 13 may also filter out either the positive half-wave signal or the negative half-wave signal. It can be seen that the output circuit 13 of the embodiments of the disclosure not only has an output function, but also has a filtering function, so that subsequent devices or functional modules which may connect with the amplifier are provided with signals required by the devices or functional modules. Herein, the filtering of the amplified input signal by the output circuit 13 is not limited to the above-mentioned ways.

Next, the composition of the circuit of the power supplying circuit 12 is described, the power supplying circuit 12 includes a power supply and a second inductor; herein, the power supply is connected with one end of the second inductor, and the other end of the second inductor is connected with the second end of the amplification circuit. In terms of implementation function, the power supply is configured to supply power to the amplification circuit 11; and the second inductor is configured to at least control the power supply to output to the second end of the amplification circuit 11 or control the amplified input signal to flow to the output circuit 13.

It may be understood that since the power supply is usually a DC power supply such as DC voltage, and the inductor (a second inductor) itself has the function of conducting DC and isolating AC, in the path where the power supply supplies power to the amplification circuit 11, the second inductor connected between the power supply and the amplification circuit 11 ensures that the DC power supply may be successfully output to the amplification circuit 11 so that it operates in the amplification region.

For the amplification circuit 11, in terms of the specific implementation, a transistor is used as the amplification circuit 11, and the first end 11.1 of the amplification circuit 11 is the gate of the transistor; the second end 11.2 of the amplification circuit 11 is the drain of the transistor; and the third end 11.3 of the amplification circuit 11 is the source of the transistor. Of course, any other device with amplification function and with at least three ends may also be used as the amplification circuit 11 of the embodiments of the disclosure.

Next, the composition of the circuit of the input circuit 10 is described. In the embodiments of the disclosure, the input circuit 10 includes a first capacitor and a capacitive circuit, and one end of the first capacitor is connected with one end of the capacitive circuit; the other end of the first capacitor is connected with the first end 11.1 of the amplification circuit 11; the other end of the capacitive circuit is connected with the third end 11.3 of the amplification circuit 11. Herein, the first capacitor is configured to filter the high-frequency signal to obtain an AC signal of the high-frequency signal in the case that the input signal is a high-frequency signal. The capacitive circuit is configured to determine the amplification gain of the high-frequency signal. Correspondingly, the amplification circuit 11 is configured to amplify the AC signal of the high-frequency signal according to the amplification gain. That is, the capacitive circuit is configured to determine the amplification gain, that is, the presence of the capacitive circuit and its connection structure (one end of the first capacitor is connected with one end of the capacitive circuit, and the other end of the first capacitor is connected with the first end 11.1 of the amplification circuit 11) of the embodiments of the disclosure may determine the amplification gain of the amplification circuit 11 to a certain extent. Moreover, this connection structure of the capacitive circuit not only brings a certain amplification gain, but also is simple in circuit design.

Specifically, due to the presence of the capacitive circuit and the first capacitor, the input signal will be divided into two branches, and one branch is transmitted through the first capacitor to be processed and then is transmitted to the first end 11.1 of the amplification circuit 11; and the other branch is transmitted through the capacitive circuit to be processed and then is transmitted to the third end 11.3 of the amplification circuit 11. Generally, since the two signals are different in amplitude, a certain signal difference is formed between the first end 11.1 and the third end 11.3 of the amplification circuit 11 due to the input of the two input signals, which may affect the value of the amplification gain to a certain extent, and for details, please refer to the formula for calculating the amplification gain of the amplifier: the amplification gain of the amplifier=transistor gain*the signal difference/the amplitude of the input signal.

It may be understood that in specific implementation, the capacitive circuit may include one or two or more capacitors, or one or two or more adjustable capacitors.

In addition, the amplifier of the embodiments of the disclosure further includes a first inductor, and in terms of the composition of the circuit, one end of the first inductor is connected with the third end 11.3 of the amplification circuit 11 and the other end of the capacitive circuit respectively; and the other end of the first inductor is grounded. Herein, the first inductor is at least configured to obtain the amplification gain of the high-frequency signal according to the attribute (amplitude or phase) of the input signal such as the high-frequency signal transmitted via the capacitive circuit.

In terms of the composition of the circuit, both the capacitive circuit and the first inductor are connected with the third end 11.3 of the amplification circuit 11, which is equivalent that the capacitive circuit is connected with the first inductor at 11.3 and grounded. In the embodiments of the disclosure, in order for the amplifier to achieve the desired amplification effect, it is also necessary to design the capacitance value C of the capacitive circuit and the inductance value L of the first inductor to satisfy $0<1-\omega^2 LC<1$; herein ω is the frequency of the input signal. The above design of the capacitance value C of the capacitive circuit and the inductance value L of the first inductor may ensure that the amplifier achieves the desired amplification effect.

Figure 3:
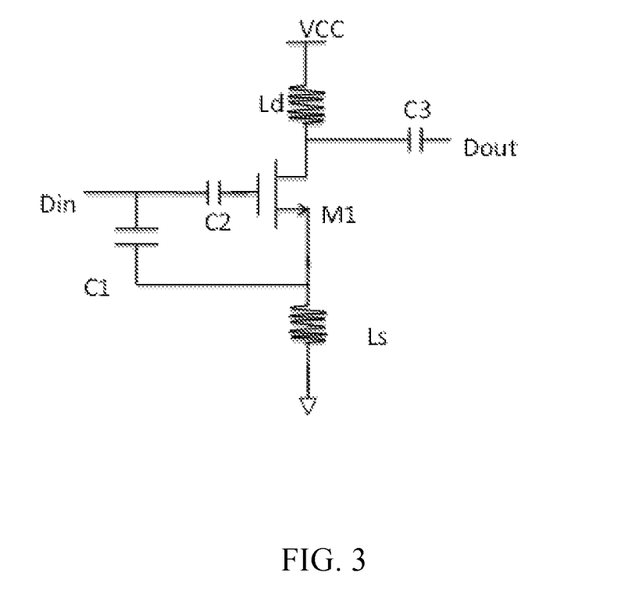
FIG. 3 is a third schematic diagram of the composition of circuit of an amplifier of an embodiment of the disclosure.

FIG. 3 is a third schematic diagram of the composition of circuit of an amplifier of an embodiment of the disclosure. With reference to FIG. 3, the composition structure of the circuit and operating principle of the amplifier provided by the embodiments of the disclosure will be described below.

As illustrated in FIG. 3, taking the amplifier circuit 11 being a transistor as an example, the input circuit 10 includes a capacitive circuit C1 and a first capacitor C2; and one end of the first capacitor C2 is connected with one end of the capacitive circuit C1; and the other end of the first capacitor C2 is connected with the gate of the transistor M1; and the other end of the capacitive circuit C1 is connected with the source of the transistor M1. The power supplying circuit 12 includes a power supply Vcc and a second inductor Ld; herein, the power supply Vcc (DC power supply) is connected with one end of the second inductor Ld, and the other end of the second inductor Ld is connected with the drain of the transistor M1. The output circuit 13 is a third capacitor C3. One end of the capacitor C3 is connected with the drain of the transistor M1.

Taking the input signal being a high-frequency signal Din, specifically a radio frequency signal as an example, in order for the transistor M1 to operate in the amplification region, the voltage provided by the DC power supply Vcc needs to be greater than the threshold voltage Vth. The voltage provided for the DC power supply Vcc may be smoothly input to the drain of the transistor, and the second inductor Ld passes the DC voltage of the DC power supply Vcc to provide the transistor M1 with a voltage greater than a threshold voltage Vth. In addition, the turn-on of the transistor also requires the voltage Vgs between the gate and the source to be higher than a certain threshold. Those skilled in the art shall know that the amplification characteristics of the transistor M1 on the Din signal are affected by the following factors: the operating voltage applied to the transistor M1 by the DC power supply Vcc and the gate-source voltage Vgs. Herein, the DC power supply Vcc may be given according to the voltage resistance of the amplifier. The effect of the operating voltage applied to the transistor M1 by the DC power supply Vcc on the amplification gain is that the transistor M1 may operate at different operating points upon operating in the amplification region, herein, the amplification region includes a static operating point, and the transistor M1 may obtain the maximum amplification gain in the case that the DC voltage provided by the DC power supply Vcc makes the transistor operate at the static operating point. Compared with the effect of the operating voltage applied to the transistor M1 by the DC power supply Vcc on the amplification gain, the gate-source voltage Vgs has a greater effect on the amplification characteristics of the transistor. In the embodiments of the disclosure, priority is given to the effect of the gate-source voltage Vgs on the amplification characteristics of the transistor, followed by the effect of the operating voltage applied to the transistor M1 by the DC power supply Vcc on the amplification gain. In the embodiments of the disclosure, the capacitor C2 in FIG. 3 may be considered as the input matching circuit of the amplifier, C3 may be considered as the output matching circuit, and the inductor Ld may be considered as the DC biasing circuit. In the embodiments of the disclosure, the input and output matching circuits and DC biasing circuit illustrated in FIG. 3 are only a specific example, and do not represent all the implementations, and any other reasonable input and output circuits and DC biasing circuits are within the protection scope of the embodiments of the disclosure.

For the high-frequency signal Din that has been input, due to the presence of the first capacitor C2 and the capacitive circuit C1, the input signal is divided into two branches, with one branch of the input signal transmitting through the first capacitor C2, and being filtered by the first capacitor C2 to obtain the AC signal of the high-frequency signal Din and input to the transistor M1 through the gate of the transistor M1. For convenience of description, the AC signal input to the gate of the transistor M1 is noted as Vg. The capacitive circuit C1 processes the other branch of the input signal, e.g. performs a phase reversal thereto, to obtain an AC signal that changes at least the phase of the high-frequency signal Din. The signal processed by the capacitive circuit C1 may reach the source of the transistor M1, and for convenience of description, the signal at the source of the transistor M1 is noted as Vs. It may be understood that the signal Vs is obtained by performing voltage division for the input signal on the capacitance C1 and the inductance Ls, and since Ls is usually relatively small, the amplitude of Vs is generally smaller than that of the input signal Din. In this way, the gate and source of the transistor M1 form an AC signal difference Vgs (Vg−Vs).

For example, when the transistor M1 in FIG. 3 operates normally in the amplification region, the high-frequency signal Din is divided into two branches, one of which is transmitted to the gate of the transistor M1 via the first capacitor C2, and the AC signal value D with the amplitude of Vg being Din is obtained. The other branch is transmitted to the source of the transistor M1 via the capacitive circuit C1, and when Vg is considered as a positive AC signal, a negative AC signal is formed at the source of the transistor M1 because the capacitive circuit C1 reverses the phase of the AC signal and reduces its value, assuming that the obtained Vs is −0.5*D. Vgs=Vg−Vs=D−(−0.5*D)=1.5D. Since the amplification of the input signal Din by the transistor M1 is actually the amplification of Vgs, the transistor M1 may obtain an amplification gain of 1.5, which is equivalent to amplifying the AC signal value D of the input signal by 1.5 times, in the case that the transistor M1 may operate in the amplification region, specifically the static operating point of the amplification region due to the voltage provided by the DC power supply Vcc. The drain of the transistor M1 outputs the signal amplified by 1.5 times. In addition, the output second inductor Ld has the characteristic of isolating AC and conducting DC, so the amplified AC signal flowing out from the drain of the transistor may be blocked by the second inductor Ld to prevent the AC signal from flowing back to the DC power supply Vcc. The amplified AC signal flowing out from the drain of the transistor filters out the AC component through the third capacitors C3 and outputs to other devices connected with the amplifier.

In the embodiments of the disclosure, the inductance Ls is a parasitic inductance to ensure that the amplification circuit may be grounded successfully. In addition, due to the presence of the parasitic inductance, the AC signal generated by the connection of the capacitive circuit C1 with the source of the transistor M1 may be a negative value instead of zero, such as −0.5*D as described above. Those skilled in the art shall know that the parasitic inductance Ls may also be set inside the chip die of the amplifier as a part of the circuit design of the amplifier.

In the above solution, due to the presence of the capacitive circuit C1 and the manner in which the capacitive circuit C1 is connected to the source of the transistor M1, at least the signal of the source of the transistor M1 may be pulled down (e.g., from the original positive signal to a negative signal), thereby enabling the amplification gain to be increased in the Vg-Vs operation.

In addition, the second inductor Ld of the embodiments of the disclosure may ensure that the AC signal flowing out from the drain of the transistor flows into the third capacitor C3, and protect the DC power supply Vcc from being interfered by the AC signal so as to normally operate.

From the composition of the circuit illustrated in FIG. 3, the structure of the amplifier of the embodiments of the disclosure is relatively simple and uncomplicated to implement. In addition, due to the presence of the capacitive circuit C1 and the manner in which the capacitive circuit C1 is connected to the source of the transistor M1, the amplification gain of the amplifier may be significantly improved; and the desired amplification effect of the input signal is realized.

Due to the addition of processing the input signal Din by the capacitive circuit C1 and the first capacitor C2, the transistor M1 obtains a larger AC signal difference, thus improving the gain of the amplifier, and the same amplification gain may be obtained without using cascaded amplifiers, and the circuit is simple and feasible to implementation.

In the embodiments of the disclosure, the transistor M1 may be a Metal-Oxide-Semiconductor Field-Effect Transistor (MOS transistor) or a bipolar-type transistor such as BJT (Bipolar Junction Transistor), HBT (Heterojunction Bipolar Transistor) etc.

In the embodiments of the disclosure, by adding a capacitive circuit which is connected between the second end of the input circuit and the third end of the amplification circuit and which may be considered as a feedforward path, to the input circuit of the amplifier, the gain of the amplifier may be improved, thus avoiding increasing the complexity of the circuit to improve the gain of the amplifier and reducing the power consumption of the circuit.

In the above solution, taking the amplifier applying to a radio frequency stage as an example, and in addition, those skilled in the art shall know that the amplifier of the embodiments of the disclosure may be applied to any reasonable occasions, such as the medium-frequency stage and the low-frequency stage, and may perform signal amplification for both the medium-frequency signal and the low-frequency signal.

Figure 4:
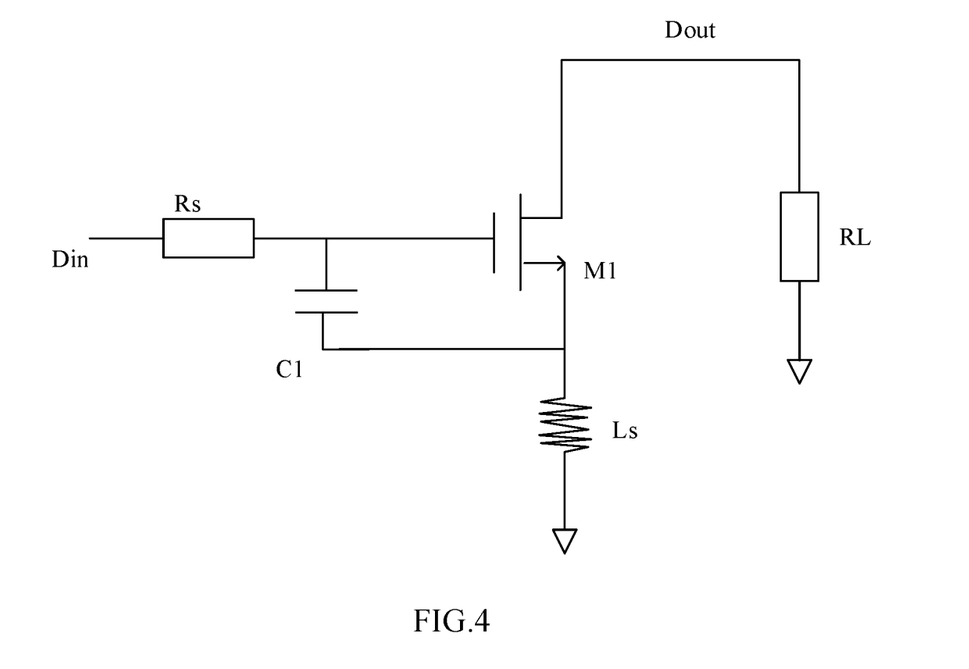
FIG. 4 is a schematic diagram of a small-signal simplified model of an amplifier circuit of an embodiment of the disclosure.

To further demonstrate the role of the amplifier of the embodiments of the disclosure in improving the amplification gain of the input signal, the DC path of the amplifier described in FIG. 3 is simplified to obtain FIG. 4. FIG. 4 is a schematic diagram of a small-signal simplified model of the amplifier illustrated in FIG. 3. In FIG. 4, DC paths in the amplifier, such as DC voltage Vcc, the second inductor Ld, the first capacitor C2 and the second capacitor C3, are omitted. In addition, the impedances of the remaining elements in the circuit are equivalent to the input impedance Rs and the output impedance RL respectively. Based on the small-signal model in FIG. 4, the (amplification) gain of the amplifier of the embodiments of the disclosure may be obtained as follows.

$$G_2(\omega) = \frac{V_{out}}{V_{in}} = \frac{g_m R_L}{1 + g_m j\omega L_S - \omega^2 L_S C_1 + j\omega C_1 R_S} = \frac{g_m R_L}{1 + g_m j\omega L_S} \cdot \frac{1}{1 + \frac{-\omega^2 L_S C_1 + j\omega C_1 R_S}{1 + g_m j\omega L_S}}.$$

Figure 5:
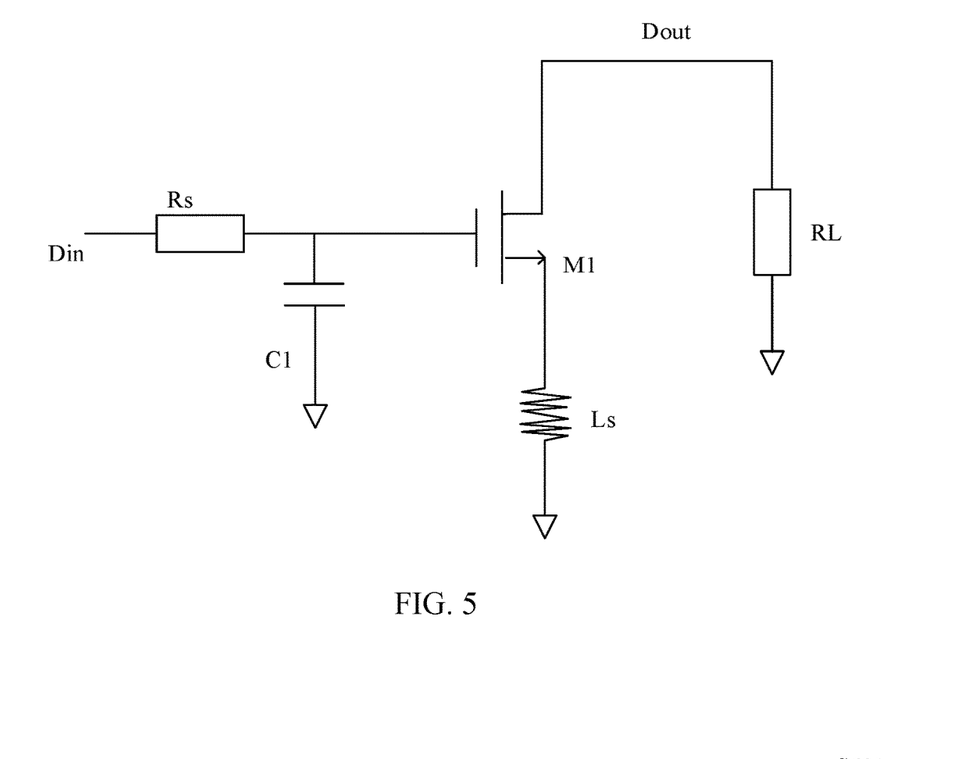
FIG. 5 is a schematic diagram of a small-signal simplified model of an amplifier in some embodiments.

For comparison of the gain, FIG. 5 provides a schematic diagram of a small-signal simplified model of a typical amplifier. Herein, the resistor Rs and the resistor $R_L$ are the equivalent input impedance and output impedance in the circuit respectively, and the capacitor C1 is a ground matching capacitor for impedance matching. According to FIG. 5, the (amplification) gain of this amplifier may be obtained as follows:

$$G_1 = \frac{V_{out}}{V_{in}} = \frac{g_m R_L}{1 + g_m j\omega L_S} \cdot \frac{1}{1 + j\omega R_S C_1}.$$

By comparing $G_2(\omega)$ with $G_1(\omega)$, the following result may be obtained:

$$G_2/G_1 = \frac{V_{out}}{V_{in}} = \frac{1 + j\omega C_1 R_S}{1 + \frac{-\omega^2 L_S C_1 + j\omega C_1 R_S}{1 + g_m j\omega L_S}} = \frac{1 + g_m j\omega L_S + j\omega C_1 R_S}{1 - \omega^2 L_S C_1 + g_m j\omega L_S + j\omega C_1 R_S}.$$

Herein, $g_m$ is the small-signal transconductance of the transistor M1 and $\omega$ is the frequency of the high-frequency signal input to the amplifier. Generally, the inductance value of the parasitic inductance $L_S$ is relatively small. In the case that in the normal operating frequency it satisfies 0<1−$\omega^2 L_S C_1$<1, then $|G_1/G_2|$>1. The amplification gain of the amplifier in FIG. 4 is improved compared with the amplification gain of the amplifier in FIG. 5.

As can be known by comparison, the amplifier of the embodiments of the disclosure may obtain a larger amplification gain than the amplifier in the related art, and also has a simpler circuit structure and less power consumption compared with the method of using cascaded amplifiers to amplify signals.

Figure 6:
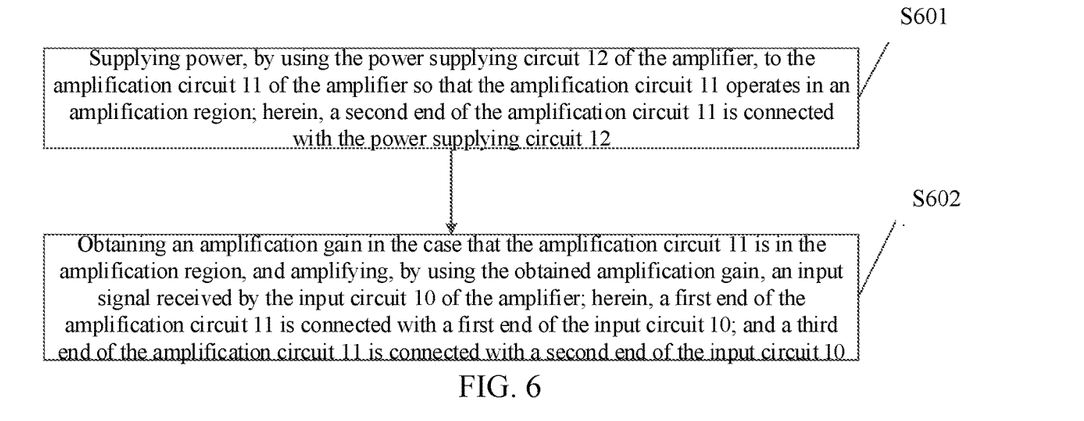
FIG. 6 is a schematic diagram of an implementation flow of an amplification method of an embodiment of the disclosure.

The embodiments of the disclosure further provide an amplification method, which is applied to the amplifier, and the amplifier includes an amplification circuit 11, a power supplying circuit 12 and an input circuit 10. As illustrated in FIG. 6, the method includes:

In S601: supplying power, by using the power supplying circuit 12 of the amplifier, to the amplification circuit 11 of the amplifier so that the amplification circuit 11 operates in an amplification region; herein, a second end of the amplification circuit 11 is connected with the power supplying circuit 12;

In S602: obtaining an amplification gain in the case that the amplification circuit 11 is in the amplification region, and amplifying, by using the obtained amplification gain, an input signal received by the input circuit 10 of the amplifier; herein, a first end of the amplification circuit 11 is connected with a first end of the input circuit 10; and a third end of the amplification circuit 11 is connected with a second end of the input circuit 10.

It should be noted that for the amplification method of the embodiments of the disclosure, the principle of the amplification method solving the problem is similar to that of the aforementioned amplifier, therefore the process and principle of implementing the amplification method may refer to the description of the process and principle of implementing the aforementioned amplifier, and the repetition thereof will not be repeated.

In several embodiments provided in the disclosure, it should be understood that the disclosed device and method may be implemented in other ways. The above-described embodiments of device are merely illustrative, for example, the division of the units is only a division based on logical functions, and there may be other divisions in actual implementations, e.g., multiple units or components may be combined, or may be integrated into another system, or some features may be ignored or may not be performed. In addition, the coupling, direct coupling or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, all the functional units in the embodiments of the disclosure may be integrated into a processing unit, and each unit may also be used separately as a single unit, and two or more units may also be integrated into a single unit; the above integrated units may be realized either in the form of hardware or in the form of hardware together with software functional units.

The methods disclosed in the method embodiments provided by the disclosure may be combined arbitrarily without conflict to obtain new method embodiments.

The features disclosed in the product embodiments provided by the disclosure may be combined arbitrarily without conflict to obtain new product embodiments.

In the embodiments of the disclosure, the amplification circuit operating in the amplification region may amplify the input signal according to the obtained amplification gain, and at least achieve the desired amplification effect. Furthermore, the amplifier provided by the embodiments of the disclosure may be used as a single-stage amplifier and also used as a multi-stage amplifier. The desired amplification effect may be achieved and the desired amplification requirement may be met with an uncomplicated circuit design.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An amplifier, comprising:
an amplification circuit;
a power supplying circuit; and
an input circuit;
wherein
a first end of the amplification circuit is connected with a first end of the input circuit;
a second end of the amplification circuit is connected with the power supplying circuit; and
a third end of the amplification circuit is connected with a second end of the input circuit; and
wherein
the power supplying circuit is configured to supply power to the amplification circuit so that the amplification circuit operates in an amplification region;
the input circuit is configured to receive an input signal; and
the amplification circuit is configured to obtain an amplification gain in case of operating in the amplification region, and amplify the input signal by using the obtained amplification gain;
wherein the input signal is a high-frequency signal; and
the input circuit comprises a first capacitor and a capacitive circuit, and one end of the first capacitor is connected with one end of the capacitive circuit; the other end of the first capacitor is connected with the first end of the amplification circuit; the other end of the capacitive circuit is connected with the third end of the amplification circuit;
wherein the first capacitor is configured to filter the high-frequency signal to obtain an alternate current signal (AC signal) of the high-frequency signal;
the capacitive circuit is configured to determine an amplification gain of the high-frequency signal; and
correspondingly, the amplification circuit is configured to amplify the AC signal according to the amplification gain.

2. The amplifier of claim 1,
wherein the amplifier further comprises a first inductor, and one end of the first inductor is connected with the third end of the amplification circuit and the other end of the capacitive circuit, respectively; and the other end of the first inductor is grounded;
wherein the first inductor is at least configured to obtain the amplification gain of the high-frequency signal according to the attribute of the high-frequency signal transmitted via the capacitive circuit.

3. The amplifier of claim 1, wherein the amplifier further comprises an output circuit connected with the second end of the amplification circuit; and the output circuit is at least configured to output the amplified input signal.

4. The amplifier of claim 3, wherein the output circuit is further configured to filter the amplified input signal to obtain an output signal, and the output signal is an AC signal of the amplified input signal.

5. The amplifier of claim 4,
wherein the power supplying circuit comprises a power supply and a second inductor; and wherein the power supply is connected with one end of the second inductor, and the other end of the second inductor is connected with the second end of the amplification circuit;
wherein the power supply is configured to supply power to the amplification circuit; and
the second inductor is configured to at least control the power supply to output to the second end of the amplification circuit or control the amplified input signal to flow to the output circuit.

6. An amplifier, comprising:
an amplification circuit;
a power supplying circuit; and
an input circuit;
wherein
a first end of the amplification circuit is connected with a first end of the input circuit;
a second end of the amplification circuit is connected with the power supplying circuit; and
a third end of the amplification circuit is connected with a second end of the input circuit; and
wherein
the power supplying circuit is configured to supply power to the amplification circuit so that the amplification circuit operates in an amplification region;
the input circuit is configured to receive an input signal; and
the amplification circuit is configured to obtain an amplification gain in case of operating in the amplification region, and amplify the input signal by using the obtained amplification gain;
wherein the amplifier further comprises a first inductor, and one end of the first inductor is connected with the third end of the amplification circuit and the other end of the capacitive circuit, respectively; and the other end of the first inductor is grounded;
wherein the first inductor is at least configured to obtain the amplification gain of the high-frequency signal according to the attribute of the high-frequency signal transmitted via the capacitive circuit; and
a capacitance value C of the capacitive circuit and an inductance value L of the first inductor satisfy $0 < 1 - \omega^2 LC < 1$;
wherein $\omega$ is a frequency of the input signal.

7. The amplifier of claim 6, wherein
the capacitive circuit comprises at least one capacitor or at least one adjustable capacitor.

8. The amplifier of claim 7, wherein
a gain of the amplifier is obtained as follows:

$$G_2(\omega) = \frac{V_{out}}{V_{in}} = \frac{g_m R_L}{1 + g_m j\omega L_S - \omega^2 L_S C_1 + j\omega C_1 R_S} = \frac{g_m R_L}{1 + g_m j\omega L_S} \cdot \frac{1}{1 + \frac{-\omega^2 L_S C_1 + j\omega C_1 R_S}{1 + g_m j\omega L_S}};$$

$C_1$ is a capacitance of a first capacitor; $R_S$ is an input impedance, $R_L$ is an output impedance, Ls is a parasitic inductance, and $g_m$ is a small-signal transconductance of a transistor M1.

9. The amplifier of claim 1, wherein the amplification circuit is a transistor; and the first end of the amplification circuit is the gate of the transistor;
the second end of the amplification circuit is the drain of the transistor; and the third end of the amplification circuit is the source of the transistor.

10. An amplification method applied to an amplifier, wherein
the amplifier comprises an amplification circuit, a power supplying circuit and an input circuit; wherein a first end of the amplification circuit is connected with a first end of the input circuit; a second end of the amplification circuit is connected with the power supplying circuit; and a third end of the amplification circuit is connected with a second end of the input circuit;

the method comprising:

supplying power, by the power supplying circuit, to the amplification circuit so that the amplification circuit operates in an amplification region;

obtaining an amplification gain in the case that the amplification circuit is in the amplification region, and amplifying, by using the obtained amplification gain, an input signal received by the input circuit;

wherein the input signal is a high-frequency signal; and the input circuit comprises a first capacitor and a capacitive circuit, and one end of the first capacitor is connected with one end of the capacitive circuit;

the other end of the first capacitor is connected with the first end of the amplification circuit; the other end of the capacitive circuit is connected with the third end of the amplification circuit;

wherein the first capacitor is configured to filter the high-frequency signal to obtain an alternate current signal (AC signal) of the high-frequency signal;

the capacitive circuit is configured to determine an amplification gain of the high-frequency signal; and correspondingly, the amplification circuit is configured to amplify the AC signal according to the amplification gain.

11. The method of claim 10, wherein the amplifier further comprises a first inductor, and one end of the first inductor is connected with the third end of the amplification circuit and the other end of the capacitive circuit, respectively; and the other end of the first inductor is grounded;

wherein the first inductor is at least configured to obtain the amplification gain of the high-frequency signal according to the attribute of the high-frequency signal transmitted via the capacitive circuit.

12. The method of claim 10, wherein the amplifier further comprises an output circuit connected with the second end of the amplification circuit; and the output circuit is at least configured to output the amplified input signal.

13. The method of claim 12, wherein the output circuit is further configured to filter the amplified input signal to obtain an output signal, and the output signal is an AC signal of the amplified input signal.

14. The method of claim 10, wherein the power supplying circuit comprises a power supply and a second inductor; and wherein the power supply is connected with one end of the second inductor, and the other end of the second inductor is connected with the second end of the amplification circuit;

wherein the power supply is configured to supply power to the amplification circuit; and the second inductor is configured to at least control the power supply to output to the second end of the amplification circuit or control the amplified input signal to flow to the output circuit.

15. The method of claim 11, wherein a capacitance value C of the capacitive circuit and an inductance value L of the first inductor satisfy $0<1-\omega^2 LC<1$;

wherein $\omega$ is a frequency of the input signal.

16. The method of claim 15, wherein the capacitive circuit comprises at least one capacitor or at least one adjustable capacitor.

17. The method of claim 16, wherein a gain of the amplifier is obtained as follows:

$$G_2(\omega) = \frac{V_{out}}{V_{in}} = \frac{g_m R_L}{1 + g_m j\omega L_S - \omega^2 L_S C_1 + j\omega C_1 R_S} = \frac{g_m R_L}{1 + g_m j\omega L_S} \cdot \frac{1}{1 + \frac{-\omega^2 L_S C_1 + j\omega C_1 R_S}{1 + g_m j\omega L_S}};$$

$C_1$ is a capacitance of a first capacitor; $R_S$ is an input impedance, $R_L$ is an output impedance, Ls is a parasitic inductance, and $g_m$ is a small-signal transconductance of a transistor M1.

18. The method of claim 10, wherein the amplification circuit is a transistor; and the first end of the amplification circuit is the gate of the transistor; the second end of the amplification circuit is the drain of the transistor; and the third end of the amplification circuit is the source of the transistor.

* * * * *